CONTACTS FOR A SEMICONDUCTOR DEVICE

Filed Dec. 29, 1965

INVENTOR
W. S. NOLL

By Robert C. Green
ATTORNEY

United States Patent Office 3,512,051

Patented May 12, 1970

3,512,051
CONTACTS FOR A SEMICONDUCTOR DEVICE

Walter S. Noll, Somerville, N.J., assignor to Burroughs Corporation, Detroit, Mich., a corporation of Michigan Filed Dec. 29, 1965, Ser. No. 517,285
Int. Cl. H01l 1/14
U.S. Cl. 317—234 2 Claims

ABSTRACT OF THE DISCLOSURE

A semiconductor device and method of making it comprising a body of semiconductor material having a plurality of P–N junctions to which ohmic contacts are made. The ohmic contacts comprise, in order, a thin film of aluminum, chrome and silver, then a large mass of tin-lead-silver solder having a high melting point, and, finally, a layer of tin-lead-silver solder having a low melting point.

This invention relates to semiconductor devices and to a method of providing electrical contacts therefor.

Semiconductor devices generally include a crystal or body of material of one type of conductivity in which a plurality of regions having opposite conductivity type are formed. These regions are separated from the main crystal by P–N rectifying junctions. In order to use such devices in circuits, an ohmic or non-rectifying contact must be made to each zone of semiconductor material. It has been found that, as semiconductor devices become smaller and smaller, and as their configurations change, the making of ohmic contacts becomes more and more difficult. This is particularly true in the case of semiconductor constructions in which an ohmic contact must be provided within a small aperture in a layer of protective material which covers the region of semiconductor material to which connection must be made.

The problem is further complicated when it is desired to provide not an elongated wire contact, but a contact in the shape of a mound or button which is connected by means of a film of solder to a printed circuit board having closely spaced components thereon which must be insulated from each other.

In addition, in such a mounting operation, the various contacts of the semiconductor device must be insulated from each other; and this presents a particularly serious problem when all of the contacts are on the same surface of the semiconductor device.

For a brief description of the invention, let it be assumed that it is desired to form a mound or button-like ohmic contact on a layer of semiconductor material to which access is had through an aperture in a protective coating, the aperture having a small diameter. The contact of the invention includes, essentially, a relatively large mass of metal which forms the core of the contact and rises above the surface of the device. On the core is provided a small quantity of a metallic solder which permits the device through its contact to be secured to a suitable substrate. The relatively large core of the contact and the metal layer formed thereon may be prepared in many different ways. However, the most effective contact and the one which can be formed by the simplest method includes a core of a high temperature solder which carries a film or layer of low temperature solder. The low temperature solder is used to make the desired contact to a substrate, and the heat required for this purpose does not melt the high temperature solder core. Both the inner solder core and the outer solder layer can be formed by dipping the device into the proper molten solders.

The invention is described in greater detail by reference to the drawing wherein.

Figure 1:
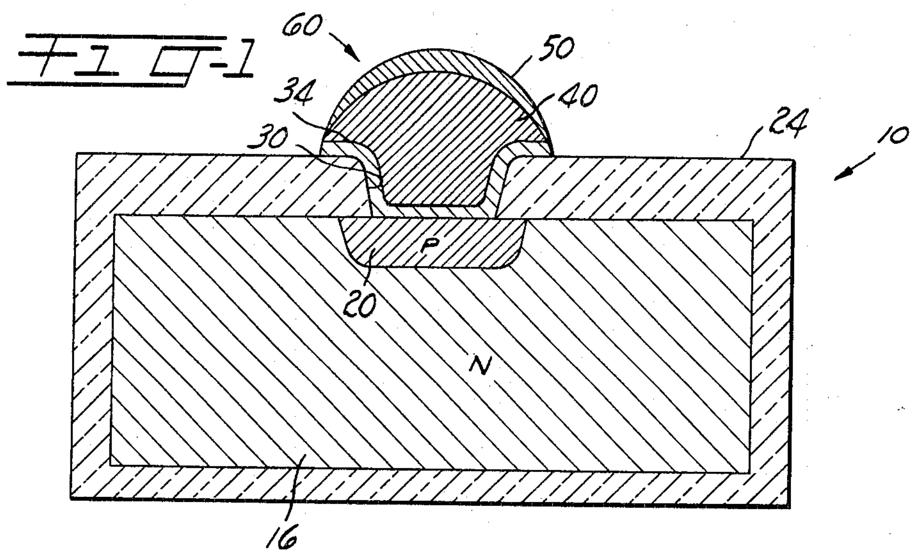
FIG. 1 is an elevational view, partly in section, of a portion of a semiconductor device embodying the invention.

For purposes of illustration, referring to FIG. 1, let it be assumed that a large-volume ohmic contact is to be made to a semiconductor device 10 of silicon which includes a layer of N-type material 16 and of P-type material 20 which forms a P–N rectifying junction therewith, the junction and all exposed silicon surfaces being protected by a layer of silicon dioxide 24. An aperture 30 is provided in the layer 24 to expose the P-type material 20 to which the desired contact is to be made.

The contact of the invention includes, essentially, first and second metals, the first being provided in aperture 30 in a relatively large mass and the second being provided, on the first large mass, in a smaller mass. Both metals are solids at room temperature, and they are miscible with each other when molten. An optimum contact is formed in aperture 30 if the first metal is also miscible with the substrate within aperture 30 to which it is secured. If the first metal itself is not miscible with the substrate, which may be, for example, silicon, silicon dioxide or both, then an intermediate metal film or layer must be provided which itself provides good adherence to the substrate and to which the first metal is adherent, preferably by being miscible therewith. With a silicon, silicon dioxide substrate, the preferred intermediate layer 34 comprises a combination of aluminum, chromium, and silver deposited preferably by evaporating first aluminum, then chromium, then a combination of chromium and silver, and then silver alone. Preferably, the film or layer 34 covers a portion of the surface of insulating layer 24 surrounding opening 30.

Next, a large mass of metal 40, which makes up the greater bulk of the desired contact, is formed in the aperture 30. The metal preferred for this portion of the contact, primarily because of the ease with which it may be handled and because it is miscible with layer 34, is tin or an alloy of tin and one or more other metals such as lead and silver. Such a material, since it is used to bond metals together, is known as a solder. According to the invention, the body of metal 40 is a relatively high temperature solder which has a melting point higher, for example by 100 degrees, than the melting point of the remainder of the contact to be described. One suitable high temperature solder has a composition of approximately 90% lead, 5% tin, and 5% silver. The quantity 40 of this material is conveniently secured to the previously deposited metal film 34 merely by dipping the crystal 10 into a pot 42 of the molten solder. The metal volume 40 forms as a bump or button which adheres to the metal film 34, fills the aperture 30, and extends above the layer of silicon dioxide 24.

It is believed that the solder mass 40 forms in the following manner. When the crystal 10 is dipped into the molten solder, it is held for a fraction of a second so that the solder can blend or mix with the metal film 34 and, particularly, the outer silver portion thereof. This action occurs very quickly. The quantity of material which adheres to the layer 34 and ultimately forms the mass 40 is generally a function of the speed with which the crystal is removed from the molten solder. After the crystal is removed from the molten solder, the volume of solder which adheres to the film tends to take a shape which has minimum surface area. The solder mass thus assumes a generally spherical contour.

Finally, the desired contact is completed by a thin film or layer 50 of a solder, again preferably a tin solder but one having a relatively low melting point, which is formed on the solder mass 40. The solder film 50 has a melting point which is the temperature at which the crystal 10 is ultimately soldered to a substrate. The solder layer 50 may also include lead, tin, and a silver in the proper proportions to provide the desired melting point. This layer 50 may be formed conveniently by dipping the crystal 10 into a pot of the desired solder. This layer of solder 50 will form as a relatively thin film of the order of 0.5 mil in thickness which follows the contour of the surface of the button 40. As above, the mass or thickness of layer 50 is determined generally by the speed with which the crystal is withdrawn from the solder pot. The desired ohmic contact 60 is now complete.

Figure 2:
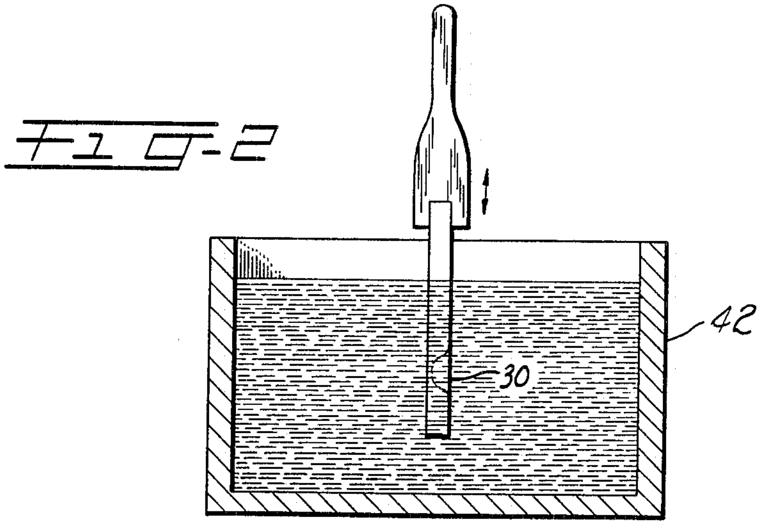
FIG. 2 is an elevational view of the apparatus used in practicing the invention.
Figure 3:
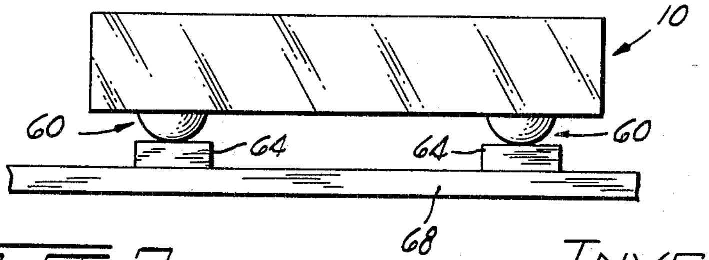
FIG. 3 is a side elevational view of a device embodying the invention secured to a printed circuit board.

The aforementioned dipping process is carried out as shown in FIG. 2 simply by grasping the edge of the crystal and inserting the crystal, edge first, into the molten solder. The crystal is merely dipped and removed, and when the crystal is removed, the desired solder material remains securely in place. Solder adheres only to the exposed metal and not to the silicon dioxide layer which encloses the semiconductor crystal. The dipping process is non-critical in all its aspects.

It is clear that the above-described process can be used to form substantially any number of metallic contact masses on a semiconductor crystal.

In order to use the completed device 10 and assuming that the device has two contacts 60, the device is secured to conductive pads 64 on a substrate such as a printed circuit board 68 merely by placing the device on the board with its contacts 60 resting on the pads 64 and then applying enough heat, through the board 68 and/or by radiation, to melt the low temperature solder film 50. When the heat is removed and the low temperature solder resolidifies, the desired contact is made with minimal spreading of the solder material since there is only a small amount of this material present. The solder mass 40 is not affected by this soldering operation.

A large volume contact of the type described above may be made by evaporating or electroplating metal. However, if these methods can be used at all to provide a siutable volume of metal, it is obvious that relatively complex and expensive equipment and considerable time are required to form a large volume of metal. It is clear that neither of these methods is as simple and as efficient and as fast as the above-described method which provides large volume contacts with inexpensive, readily available metals and equipment.

What is claimed is:

1. A semiconductor device comprising:

a body of silicon semiconductor material having an outer surface, a P-N junction formed by a region of silicon semiconductor material in rectifying contact with said silicon body, said junction being exposed at said outer surface of said body, a protective coating of insulating material covering said surface, said region of semiconductor material and said junction exposed at said surface.

said protective coating having an aperture exposing a portion of said region of material which comprises a portion of said P-N junction, a relatively large mass of a first metallic solder material secured in ohmic contact to said region of semiconductor material forming said P-N junction and rising therefrom above said outer surface of said body, said first solder material having a relatively high melting point, and a relatively thin layer of a second metallic solder material covering the exposed surface of said large mass of said first solder material, said second solder material having a relatively low melting point which is substantially the temperature used to secure the device to a substrate, said first and second solder metals being tin-lead-silver solders.

2. A semiconductor device comprising:

a body of silicon semiconductor material having an outer surface, a P-N junction formed by a region of silicon semiconductor material in rectifying contact with said body, said junction being exposed at said outer surface of said body, a protective coating of insulating material covering said surface, said region of semiconductor material and said junction exposed at said surface, said protective coating having an aperture exposing a portion of said region of material which comprises a portion of said P-N junction, a first thin metallic bonding film in intimate ohmic contact with said portion of said region of semiconductor material exposed by said aperture in said protective coating and in intimate contact with said protective coating adjacent to said region of semiconductor material, a relatively large mass of a first metallic solder material secured in ohmic contact to said metallic bonding film and rising therefrom above said outer surface of said body, said first solder material having a relatively high melting point, and a relatively thin layer of a second metallic solder material covering the exposed surface of said large mass of said first solder material, said second solder material having a relatively low melting point which is substantially the temperature used to secure the device to a substrate, said first thin film comprising successive thin layers of aluminum, chromium, and silver, and said second and third metals being tin-lead-silver solders.

References Cited

UNITED STATES PATENTS

| | | | |
|---|---|---|---|
| 2,965,519 | 12/1960 | Christensen | 148—180 |
| 3,272,669 | 9/1966 | Im | 148—179 |
| 3,288,662 | 11/1966 | Weisberg | 148—1.5 |
| 3,154,450 | 10/1964 | Hoeckelman et al. | 317—234 |
| 3,290,565 | 12/1966 | Hastings | 317—234 |
| 3,292,240 | 12/1966 | McNutt et al. | 317—234 |
| 3,323,956 | 6/1967 | Gee | 317—234 |

JERRY D. CRAIG, Primary Examiner

U.S. Cl. X.R.

29—591